(12) United States Patent
Matsumoto et al.

(10) Patent No.: US 10,527,669 B2
(45) Date of Patent: Jan. 7, 2020

(54) IC TEST SYSTEM

(71) Applicant: HAPPYJAPAN, INC., Yamagata-shi (JP)

(72) Inventors: Shouhei Matsumoto, Yamagata (JP);
Shinichi Hasebe, Yamagata (JP);
Mitsuo Koizumi, Yamagata (JP);
Yoshinori Arai, Yamagata (JP);
Masayoshi Yokoo, Yamagata (JP);
Keitaro Harada, Yamagata (JP)

(73) Assignee: HappyJapan, Inc., Yamagata-shi, Yamagata (JP)

( * ) Notice: Subject to any disclaimer, the term of this patent is extended or adjusted under 35 U.S.C. 154(b) by 0 days.

(21) Appl. No.: 15/756,435

(22) PCT Filed: Aug. 31, 2015

(86) PCT No.: PCT/JP2015/074755
§ 371 (c)(1),
(2) Date: Feb. 28, 2018

(87) PCT Pub. No.: WO2017/037844
PCT Pub. Date: Mar. 9, 2017

(65) Prior Publication Data
US 2018/0267097 A1    Sep. 20, 2018

(51) Int. Cl.
*G01R 31/28* (2006.01)
*G01R 31/26* (2014.01)
*G01R 1/04* (2006.01)

(52) U.S. Cl.
CPC ....... *G01R 31/2887* (2013.01); *G01R 1/0433* (2013.01); *G01R 31/26* (2013.01); *G01R 31/2893* (2013.01)

(58) Field of Classification Search
CPC .. G01R 1/0433; G01R 31/26; G01R 31/2887; G01R 31/2893; G01R 31/2891;
(Continued)

(56) References Cited

U.S. PATENT DOCUMENTS 6,153,887 A * 11/2000 Furuta ................ H05K 13/0812
250/559.4
6,456,062 B2 * 9/2002 Yamashita ............. G01R 31/01
324/757.01
(Continued)

FOREIGN PATENT DOCUMENTS

JP   H06-058986 A   3/1994
JP   09-074128 A    3/1997
(Continued)

OTHER PUBLICATIONS

International Search Report of PCT/JP2015/074755 in 2 pages.

*Primary Examiner* — Vinh P Nguyen
(74) *Attorney, Agent, or Firm* — Knobbe, Martens, Olson & Bear, LLP (57) ABSTRACT

An IC device 4 of the present invention includes a robot arm 6 for conveying IC devices D to a test head 2 for testing the IC devices. The test head 2 includes sockets 3 having placement surfaces 3a onto which the IC devices D are placed and for attaching the IC devices placed on the placement surfaces to the test head. The robot arm 6 includes a contact head 61 for holding the IC devices while the IC devices are conveyed and for pressing the IC devices onto the test head during testing, and a non-contact displacement meter 71 that moves in association with the movement of the contact head 61. The non-contact displacement meter 71 is mounted on the robot arm 6 so as to measure a distance by emitting a beam in a direction perpendicular to the placement surfaces 3a.

7 Claims, 7 Drawing Sheets

(58) Field of Classification Search
CPC .............. G01R 31/2867; G01R 1/0466; G01R 31/2889; G01R 31/2834; G01R 1/073; G01R 31/2601; G01R 1/06794; G01R 1/07364; G01R 31/01; G01R 31/02; G01R 31/3025; G01R 19/0069; G01R 1/04; G01R 31/026; G01R 31/2886; G01R 31/318555; G01R 31/31905; B65G 17/12; B65G 35/06; B65G 49/00; B65G 47/24; G06F 3/012; G06F 3/013; G06F 3/011; G06F 3/0346; B25J 15/0052; B25J 9/1697

See application file for complete search history.

(56) References Cited

U.S. PATENT DOCUMENTS

| | | | |
|---|---|---|---|
| 6,462,534 B2* | 10/2002 | Kang | G01R 1/0408 324/750.05 |
| 6,784,657 B2* | 8/2004 | Fujishiro | G01R 31/2887 324/750.19 |
| 8,542,029 B1 | 9/2013 | Mardi | |
| 2008/0243428 A1 | 10/2008 | Kim et al. | |
| 2011/0288667 A1 | 11/2011 | Noda et al. | |
| 2013/0057310 A1 | 3/2013 | Hasegawa et al. | |

FOREIGN PATENT DOCUMENTS

| | | |
|---|---|---|
| JP | 10-068759 A | 3/1998 |
| JP | 2009-145153 A | 7/2009 |
| JP | 2011-180156 A | 9/2011 |
| TW | 200909812 A | 3/2009 |
| TW | 2015229993 A | 6/2015 |
| TW | 201527773 A | 7/2015 |
| WO | 2010/092981 A1 | 8/2010 |
| WO | 2015/083238 A1 | 6/2015 |

* cited by examiner

IC TEST SYSTEM

TECHNICAL FIELD

The present invention relates to an IC test system for testing IC devices.

RELATED ART

A test apparatus that conducts an energization test for IC devices during IC device manufacturing processes is referred to as an IC tester or an IC test system. Furthermore, the conveying device for conveying the IC device for the energization test performed by the IC tester is referred to as an IC handler. IC testers are designed to energize IC devices by pressing an IC device which is attached to a test head via a test socket against the test head. The device which presses the IC device in the socket is referred to as a contact head. In recent IC handlers, the contact head is attached to a robot arm that operates to load the IC device into the socket.

When an IC device which is loaded into the test socket is left without being discharged from the socket due to some circumstances, a newly loaded IC device will become stacked on the IC device left in the socket. Such circumstances can occur when, for example, a worker fails to discharge a dummy device for resistance measurements from the socket after the dummy device has been loaded into the socket and to check the test head. When two IC devices are stacked in the socket, the IC device which was left in the socket maintains electrical contact with the test head, such that accurate test results of the newly loaded IC device cannot be obtained. Furthermore, if the IC devices loaded into the socket are pressed by the contact head, the IC devices or the contact head may become damaged in some cases. Thus, there is a need for a technology to appropriately prevent circumstances in which two IC devices are stacked and loaded into a test socket. Such a state is hereinafter referred to as an IC device double-overlap state.

In connection thereto, Patent Document 1 discloses a technology in which a fiber sensor, which emits a beam which crosses the socket, is installed in the socket, and which determines whether or not an IC device has been left in the socket depending on whether or not the beam of the fiber sensor is blocked. Furthermore, Patent Document 2 discloses a technology in which an image capture device such as a line sensor or an area sensor is installed above the socket, and which determines whether or not an IC device has been left in the socket by analyzing the image data of the socket captured by the image capture device. More specifically, Patent Document 2 determines whether or not an IC device has been left in the socket by comparing reference data prepared in advance for each socket type with image data captured by the image capture device.

However, according to the simple technique using a fiber sensor as disclosed in Patent Document 1, an IC device which has been left in the socket may not be accurately detected when the IC device to be tested is thin (e.g., when the thickness of the IC device is 0.5 mm or less). Further, according to the technique of Patent Document 1, since it is necessary to precisely position the optical axis of the fiber sensor with respect to the socket each time the dimensions of the IC device change, the burden of preparation work for the operator is significant. Furthermore, according to the technique of Patent Document 2, since it is necessary to adjust the position or quantity of light of the lighting device illuminating the socket or to generate new reference data each time the color, shape, etc., of the IC device or the socket changes, the burden of preparation work for the operator is also significant.

Furthermore, conventionally, when an IC device left in the socket is detected, testing is temporarily suspended. This brings about a problem in that the production number drops.

PRIOR ART DOCUMENTS

Patent Document

[Patent Document 1] Japanese Unexamined Patent Publication (Kokai) No. 6-58986
[Patent Document 2] Japanese Unexamined Patent Publication (Kokai) No. 2009-145153

SUMMARY OF THE INVENTION

Problem to be Solved by the Invention

An IC test system that can prevent an IC device double-overlap state, in which significant preparation work is not required even if the socket of the test head or the type of IC device to be tested is changed, and in which detection can be performed without interrupting production and testing is required.

Means to Solve the Problem

According to a first embodiment of the present invention, there is provided an IC test system comprising a robot arm for conveying an IC device to a test head for testing the IC device, in which the test head is provided with a socket having a placement surface onto which the IC device is placed, the robot arm comprises a contact head for holding the IC device while the IC device is conveyed and for pressing the IC device onto the test head during testing and a non-contact displacement meter that moves in association with the movement of the contact head, and the non-contact displacement meter is mounted on the robot arm so as to measure a distance in a direction perpendicular to the placement surface.

Effect of the Invention

According to the first embodiment of the present invention, a non-contact displacement meter that moves in association with the movement of the contact head which holds the IC device is provided. Thus, for example, it is possible to perform measurement while conveying the IC device to the test head using the contact head. Since it is possible to determine, by measuring while conveying, the risk of the IC device double-overlap state, there is no interruption to testing and production of the IC devices, and the production number can be improved. Furthermore, according to the present application, since the distance in the direction perpendicular to the placement surface is measured, there is no need for significant preparation work when the socket or the type of IC device is changed, as compared with the conventional technology.

BRIEF DESCRIPTION OF THE DRAWINGS

FIGS. 7(a) and (b) are views showing contact heads of the IC test system of another embodiment of the present invention, in which (a) shows a state in which the IC device is held normally, and (b) shows a state in which an abnormality has occurred.

BEST MODE FOR CARRYING OUT THE INVENTION

A detailed description of the embodiments of the present invention is given below with reference to the drawings. In the drawings, the same constituent elements are given the same reference numerals. Note that the following description does not limit the technical scope or the meaning of the terms of the invention described in the claims.

Figure 1:
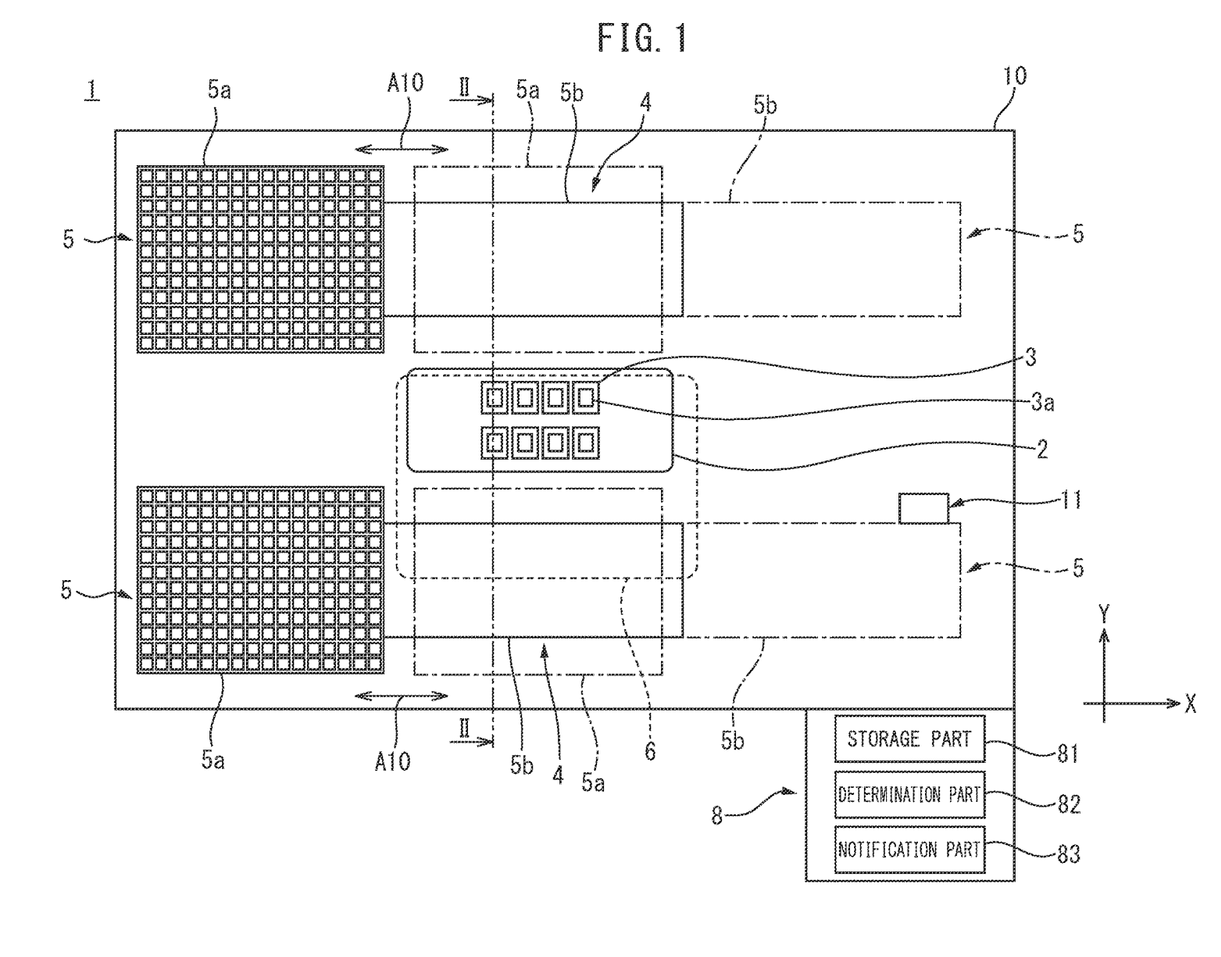
FIG. 1 is a plan view of the test system of the first embodiment of the present invention.

The IC test system according to an embodiment of the present invention will be described with reference to FIGS. 1 to 6. FIG. 1 is a plan view of the test system 1 including an exemplary IC handler 4 according to the present embodiment. As illustrated in FIG. 1, the IC test system 1 includes a table-shaped base 10, a test head 2 mounted on the base 10, and a plurality of sockets 3 arrayed on the test head 2. The test head 2 performs energization tests on IC devices loaded into the sockets 3. Each socket 3 has a placement surface 3a onto which an IC device is placed and which attaches the IC device placed on the placement surface 3a to the test head 2.

The IC handler 4 of the present embodiment is a conveying device for conveying the IC device for energization testing using the test head 2 of the IC test system 1. The test system 1 according to the example of FIG. 1 includes a pair of IC handlers 4, 4. These IC handlers 4, 4 include a pair of shift plates 5, 5 which are movable along the upper surface of the base 10 in the direction of arrow A10, and a robot arm 6 arranged above the base 10. Note that in the example of FIG. 1, the direction parallel to the movement direction of the shift plate 5 is defined as the X direction, and the direction perpendicular to the X direction on the upper surface of the base 10 is defined as the Y direction (the same applies for the other drawings). The test head 2 according to the present example includes two rows of sockets 3 arranged in the Y direction, and each row includes four sockets 3 arranged in the X direction. In other words, the test head 2 according to the present example has a total of 8 sockets arranged therein. The placement surfaces 3a of these sockets 3 are oriented so as to be parallel to both the X direction and the Y direction. A printed circuit board called a performance board is arrange between the test head 2 and the sockets 3. Generally, the number and arrangement of the sockets 3 in the test head 2 is determined in accordance with the circuit pattern of the performance board.

In the example of FIG. 1, the pair of IC handlers 4, 4 are symmetrically arranged in the Y direction so as to interpose the sockets 3, and each of the IC handlers 4 have the same configuration. Only one of the IC handlers 4 will be described below. In the example of FIG. 1, the shift plate 5 of the IC handler 4 has a loading area 5a and a discharge area 5b arranged side-by-side in the X direction, and is moved in the X direction by a driving mechanism (not shown). The loading area 5a is an area in which an IC device which is to be loaded into the socket 3 is placed prior to testing. The IC devices prior to testing are placed on the loading area 5a by a loading robot (not shown). The discharge area 5b is an area in which IC devices discharged from the socket 3 are placed after testing. The IC devices placed on the discharge area 5b are conveyed to a tray according to the result of the energization test by an unloading robot (not shown).

As shown by the arrows A10 of FIG. 1, the shift plate 5 can move in the X direction between a loading position in which the loading area 5a is adjacent to the sockets 3 and a discharge position in which the discharge area 5b is adjacent to the socket 3. In the example of FIG. 1, the shift plate 5 at the discharge position is indicated by the solid line and the shift plate 5 at the loading position is indicated by the single-dotted chain line. By shifting from the discharge position to the loading position, the shift plate 5 according to the present example conveys the IC devices placed on the loading area 5a prior to testing to the vicinity of sockets 3. The IC devices prior to testing are then loaded into the sockets 3 by the robot arm 6 of IC test system 1.

Figure 2:
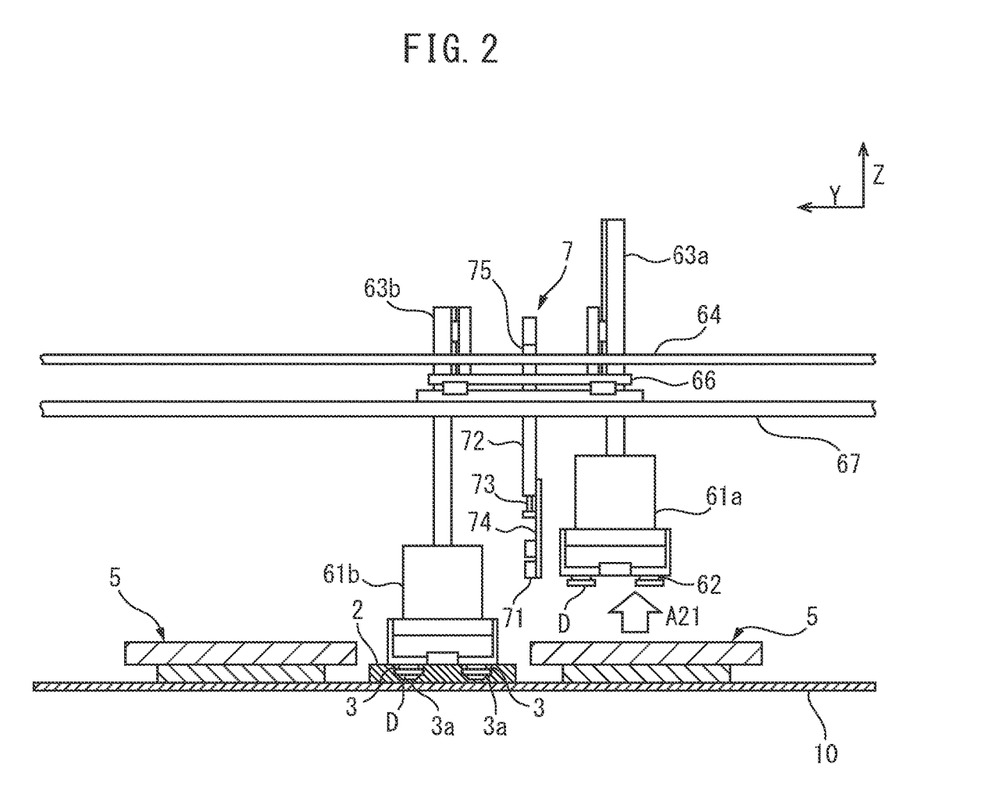
FIG. 2 is a cross-sectional view taken along line II-II of FIG. 1, showing the configuration of the IC test system.

In the example of FIG. 1, the robot arm 6 continuously performs the operation of loading IC devices into the test sockets 3 prior to testing and the operation of discharging IC devices from the sockets 3 after testing. FIG. 2 is a cross-sectional view taken along line II-II in FIG. 1, showing the operation in which the robot arm 6 loads an IC device into the socket 3 prior to testing. Note that, the Z direction of FIG. 2 is the direction perpendicular to both the X direction and the Y direction in FIG. 1, i.e., the direction perpendicular to the placement surface of the sockets 3 (the same applies to the other drawings).

In the example of FIG. 2, the robot arm 6 includes two contact heads 61 that press IC devices D against the test head 2 during the energization testing of the IC devices D (hereinafter, the contact head 61 on the right side when facing the drawing is referred to as the first contact head 61a and the contact head 61 on the left side when facing the drawing is referred to as the second contact head 61b). Each of the contact heads 61 includes a suction nozzle 62 which suctions and holds IC devices D. The number and arrangement of the suction nozzles 62 of each of the contact heads 61 correspond to the number and arrangement of the sockets 3 in the test head 2.

The first contact head 61a and the second contact head 61b are connected by a Y-axis ball screw 64 and a linear guide 67, and can move in association in the left and right directions (Y-axis direction). Furthermore, the first contact head 61a and the second contact head 61b can move independently in the vertical direction (Z-axis direction) using the Z-axis sliders 63a, 63b.

Figure 3:
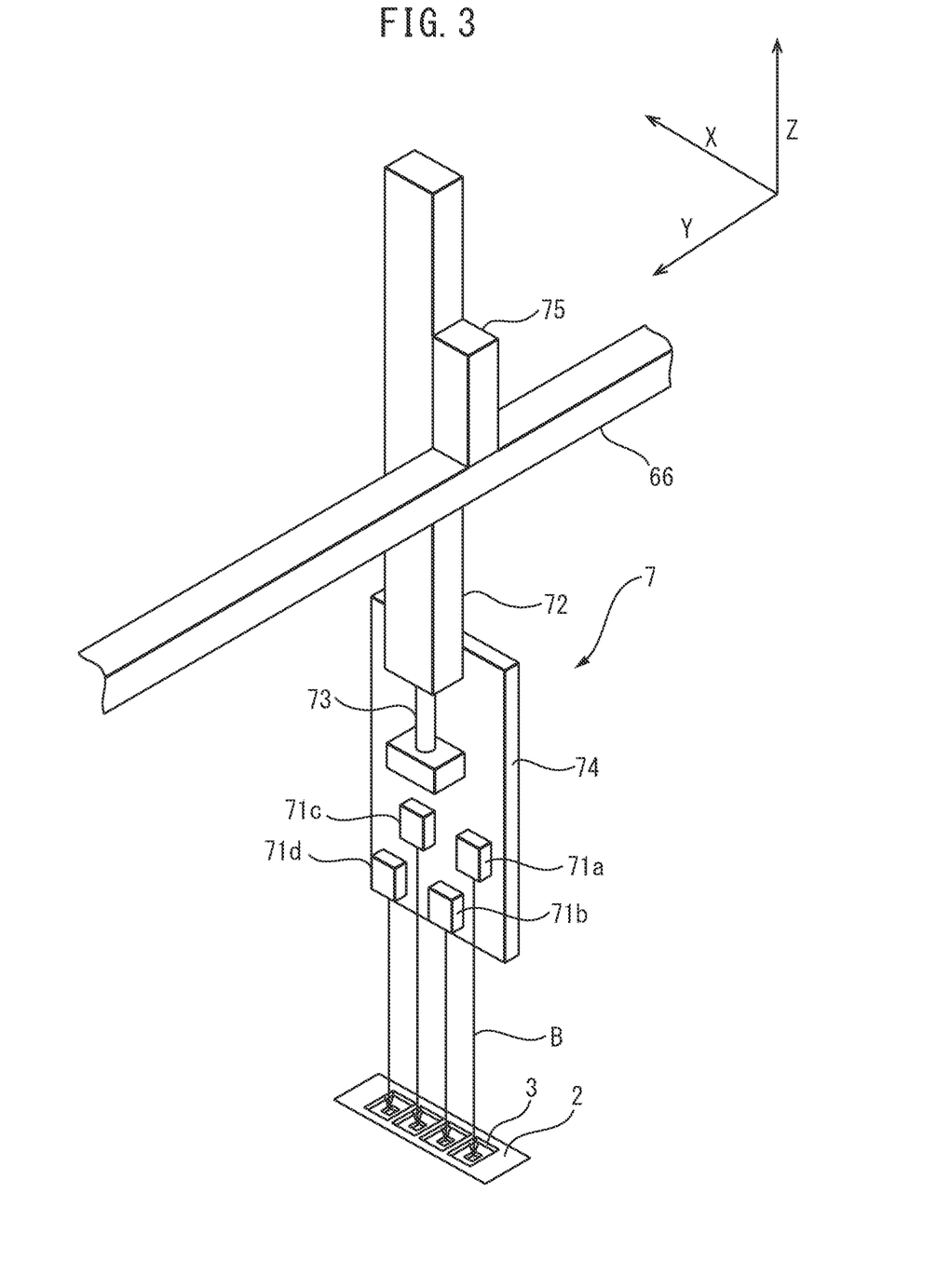
FIG. 3 is a perspective view showing the displacement measuring unit.

The robot arm 6 of the present embodiment includes a displacement measuring unit 7 between the first contact head 61a and the second contact head 61b. As shown in FIG. 3, the displacement measuring unit 7 includes a support rod 72, a vertical cylinder 73 provided on the lower end of the support rod 72, a vertical plate 74 which is moved in the vertical direction by the vertical cylinder 74, and a plurality of non-contact displacement meters 71a to 71d provided on the lower end of the vertical plate 74. The non-contact displacement meters 71 are provided corresponding to the number of sockets 3 in the direction of the row. In the present embodiment, four non-contact displacement meters 71a to 71d (hereinafter collectively referred to as the non-contact displacement meter 71) are provided, as shown in FIG. 3.

The non-contact displacement meter 71 measures the distance from the non-contact displacement meter to the object to be measured by emitting a beam towards the measurement object. The non-contact displacement meter 71 may be, for example, a laser displacement meter that emits a laser beam, an ultrasonic displacement meter that emits an ultrasonic beam, or the like.

The displacement measuring unit 7 is installed by attaching the support rod 72 to the Y-axis slider 66 provided between the first contact head 61a and the second contact head 61b. When the first contact head 61a and the second contact head 61b move in the Y-axis direction, the displacement measuring unit 7 moves in the Y-axis direction in association with the movement thereof. Therefore, the displacement measuring unit 7 does not interfere with the first contact head 61a and the second contact head 61b. The displacement measuring unit 7 can move the non-contact displacement meters 71a to 71d vertically by vertically moving the vertical plate 74 using the vertical cylinder 73 provided on the support rod 72.

The non-contact displacement meter 71 at the measurement position measures the distance to the measurement object present in the beam propagation direction by emitting the laser beam B in the direction perpendicular to the placement surface 3a of the socket 3. The non-contact displacement meter 71 of the present embodiment is mounted on the robot arm 6 so as to measure distance by emitting a beam in the direction perpendicular to the placement surfaces 3a, and to measure the distance from each non-contact displacement meter to the placement surfaces 3a of sockets 3. The distance measured in this way is referred to below as the measured distance d. Furthermore, the non-contact displacement meter 71 at the measurement position can measure the measured distance d at a plurality of measurement points in the socket 3 by moving in the Y direction together with the contact head.

Figure 4:
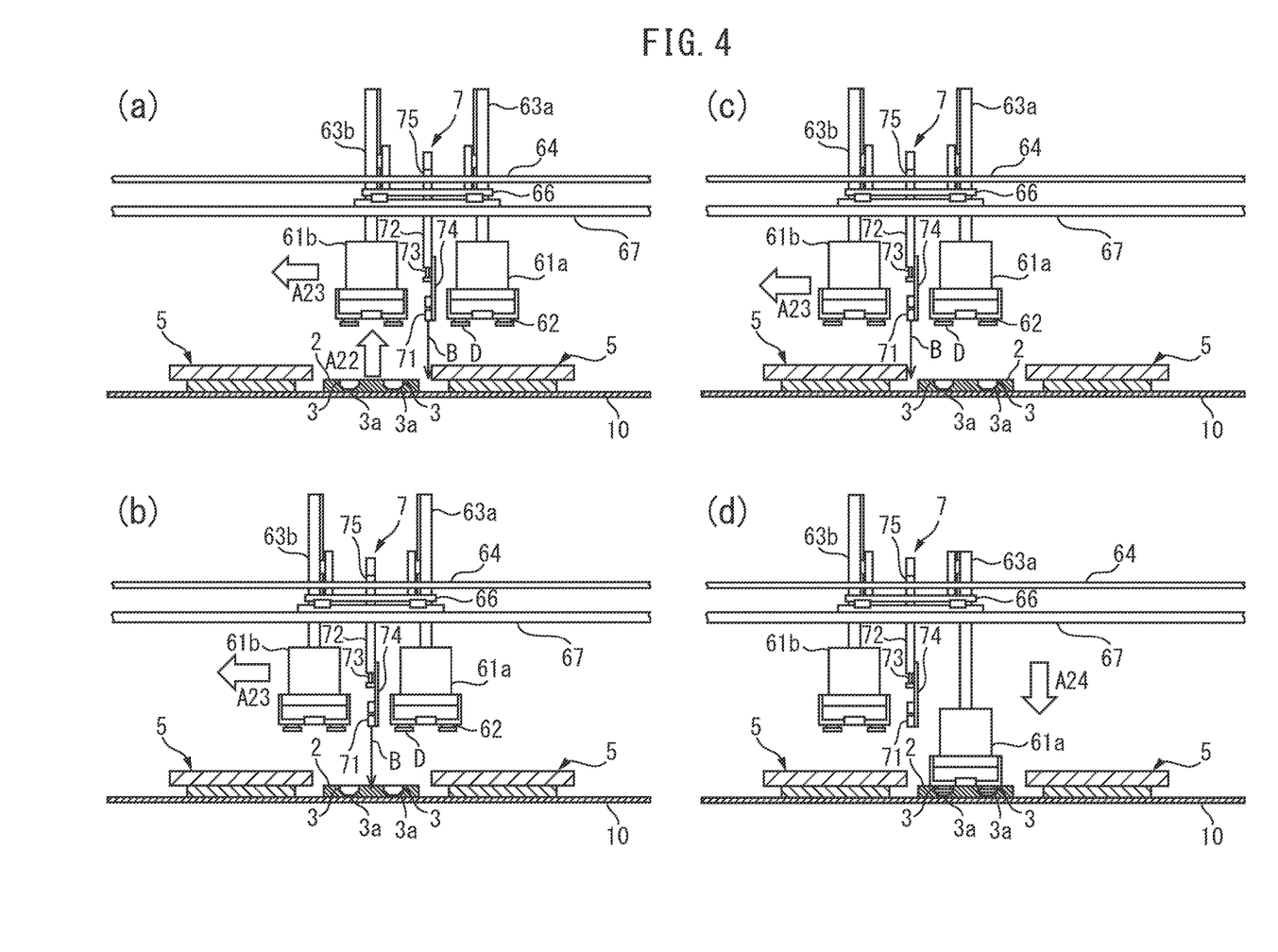
FIGS. 4(a) to (d) are views showing the loading and discharging processes of IC devices using a robot arm, and the scanning operation of the socket using a non-contact displacement meter.

The robot arm 6 of the present embodiment, in accordance with the following processing shown in FIGS. 2 and 4, moves the contact heads 61a and 61b, loads the IC devices D into the sockets 3 prior to testing, and measures the distance from the non-contact displacement meter 71 to the placement surfaces 3a of the sockets 3 using the displacement measuring unit 7.

FIG. 2 shows a state in which the first contact head 61a holds an IC device D and the second contact head 61b places the IC device D onto the test head 2.

The first contact head 61a moves in the Y direction and the Z direction when the shift plate 5 is at the loading position, whereby the suction nozzle 62 is brought into contact with the IC devices D on the loading area 5a. Next, when the suction nozzle 62 suctions and holds the IC devices D, the contact head 61a is moved in the Z direction indicated by arrow A21 in FIG. 2, whereby the IC devices D are lifted from the loading area 5a. Furthermore, the second contact head 61b shown in FIG. 2 is in a state in which the IC devices D mounted on the test head 2 are suctioned.

Next, as shown in FIG. 4(a), the second contact head 61b moves in the direction of arrow A22 (upwards in the Z-axis direction) using the Z-axis slider 65b, and lifts the IC devices D placed on the test head 3. After moving by a predetermined distance, the robot arm 6 next moves the first contact head, the second contact head, and the displacement measuring unit 7 in the Y-axis direction along arrow A23 shown in the drawing. When moving in the Y-axis direction, the displacement measuring unit 7 begins measuring distance by emitting beam B in the direction of the placement surfaces 3a.

As shown in FIG. 4(b) and FIG. 4(c), the robot arm 6 moves the first contact head 61a, the second contact head 61b, and the displacement measuring unit 7 in the Y-axis direction (the direction of arrow A23) until the first contact head 61a is positioned above the test head 3. At such a time, the displacement measuring unit 7 continues to measure the distance to the test head 3. As a result of measuring the distance, when a distance different from the normal distance is measured on the placement surface, it is determined, according to a determination method described later, that some abnormality has occurred on the test device 3, for example, an IC device remains without being suctioned by the contact head 61 and two overlapping devices are present, and an alarm or the like is generated, to stop the operation of the robot arm.

When the displacement measuring unit 7 does not detect an abnormality, the first contact head 61 is moved in the direction of arrow A24 of FIG. 4(d) (downwards in the Z-axis direction), and the IC devices D are placed on the socket 3. The IC devices D in the socket 3 are then pressed against the test head 2 by the first contact head 61a. As a result, the IC devices D in the socket 3 are electrically connected with the test head 2, and the energization testing of the IC devices D begins. In this way, the robot arm 6 according to the present example further performs an operation of pressing the IC devices in the sockets 3 against the test head 2. When the energization testing of the IC devices D has started, the shift plate 5 is moved from the loading position to the discharge position.

After the energization testing of the IC devices in the sockets 3 has finished, the suction nozzle 62 again suctions and holds the IC devices in the sockets 3. Next, the IC devices D are lifted from the placement surfaces 3a of the sockets 3 by moving the first contact head 61a upwards in the Z direction. By moving the first contact head 61a, the displacement measuring unit 7 again measures the distance from the non-contact displacement meter 71 to the placement surfaces 3a, and detects the presence or absence of double-overlapped devices on the sockets 3. By repeatedly performing this series of operations, the robot arm 6 repeatedly loads and discharges IC devices D using the contact head 61 and performs detection using the displacement measuring unit 7. Since detection is performed each time loading and discharging is performed, it is not necessary to stop the energization testing or the loading/discharging process of the IC devices to perform detection, as in the conventional technology, improving the availability factor of the test head 2, and in turn, the productivity of the IC devices.

The IC test system 1 according to the present embodiment performs the process of determining the risk that two IC devices D will be in a stacked state based on the measured distance d of the non-contact displacement meter 71. This process will be referred to as double-overlap determination processing below. Referring again to FIG. 1, the IC test system 1 of the present embodiment includes a control unit 8 for controlling the operation of each component, such as the robot arm 6 and the IC handler 4, and executing various arithmetic processes. In particular, the control unit 8 according to the present embodiment includes a storage part 81 for storing various data, a determination part 82 for executing the above-mentioned double-overlap determination processing, and a notification part 83 for notifying the operator of various messages.

Figure 6:
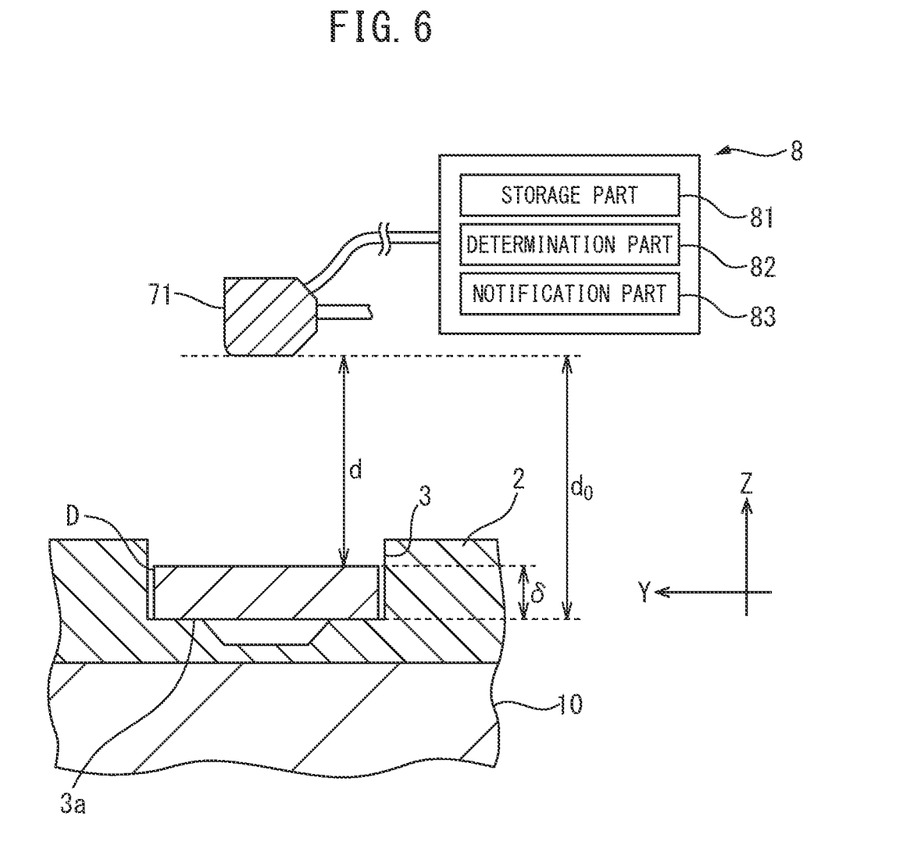
FIG. 6 is a view describing the processing for determining double-overlap using the IC handler of the present embodiment.

As shown in FIG. 6, in the double-overlap determination process, the determination part 82 first acquires the measurement distance d with respect to the measurement point of the socket 3 above which it passes in association with the movement of the non-contact displacement meter in the Y-axis direction from the plurality of non-contact displacement meters 71. Next, the determination part 82 determines, which is the distance from the non-contact displacement meter to the placement surface 3a, which has been previously measured in a normal state and which is stored in the storage part 81 for each non-contact displacement meter. The reference distance $d_0$ is also measured for multiple measurement points, similarly to the measured distance d. The determination part 82 then calculates the difference $\delta$ ($\delta=d_0-d$) between the reference distance $d_0$ and the measured distance d of each non-contact displacement meter for each measurement point. When there is an object to be measured, such as and IC device D, in socket 3, this difference $\delta$ represents the thickness of the measurement object in the Z direction.

Next, the determination part 82 acquires the threshold t for the double-overlap determination processing from the storage part 81. This threshold t can be set in advance by the operator and stored in the storage part 81. The threshold value t according to the present example represents the maximum allowable value of the variation amount of the distance from the non-contact displacement meter 71 at the measurement position to the placement surface 3a. Such variations in the distance may occur due to, for example, repeated operations of each part of the IC handler 4 and thermal deformation of each part due to high temperature testing, etc. Therefore, the threshold t according to the present example can be determined based on repeat accuracy of the moving parts of the shift plate 5 and the displacement measuring unit 7, as well as the deformation amounts, etc., of the socket 3, the shift plate 5, and the displacement measuring unit 7 due to high temperature testing.

Referring again to FIG. 6, the determination part 82 compares the difference $\delta$ calculated for each measurement point and the threshold t. The determination part 82 then calculates the ratio of the measurement point where the difference $\delta$ is greater than the threshold t (i.e., the measurement point where $\delta>t$) to the total measurement points. A measurement point where the difference $\delta$ is larger than the threshold t is referred to below as an abnormal measurement point. The determination part 82 then determines whether the ratio of abnormal measurement points exceeds a predetermined level. The predetermined level referred to here is, for example, 75% of all measurement points. When the ratio of abnormal measurement points exceeds the predetermined level, the determination part 82 determines that the state of socket 3 is abnormal. In other words, the determination part 82 determines that as at least one IC device D has already been loaded in the socket 3, there is a risk that two or more IC devices D are stacked in the socket 3. In such a case, the notification part 83 of the control unit 8 notifies the operator with a warning message. Conversely, if the ratio of abnormal measurement points does not exceed the predetermined level, the determination part 82 determines that the state of the socket 3 is normal. In other words, the determination part 82 determines that there is no risk that two or more IC devices D are loaded in the socket 3 in an overlapping manner, as there are no IC devices D present in the socket 3. As a result, since it is possible to determine the risk of an IC device D double-overlap state, an IC device D double-overlap state can be reliably prevented. Note that, the IC device loading and discharging processes can be automatically stopped when a sensor mounted on each part of the IC test system 1 detects an abnormality or can be manually stopped by an operator for inspection of the test head 2, the socket 3, etc.

As described above, according to the IC test system of the present embodiment, the IC device double-overlap state determination processing is performed based on the measured distance d of the non-contact displacement meter 71 measured with respect to the placement surface 3a of the socket 3. Thus, according to the IC test system 1 of the present embodiment, even if the type of socket 3 or IC device D is changed, simply by storing a new reference distance $d_0$ or threshold t in the storage part 81, it is possible to determine the risk of an IC device D double-overlap state. As a result, according to the IC test system 1 of the present embodiment, significant preparation work when the type of the socket 3 or the IC device D is changed is not required. Furthermore, if a laser displacement meter is used as the non-contact displacement meter, since laser displacement meters generally have resolutions on the micron scale, according to the IC test system 1 of the present embodiment, even when a thin IC device D having a thickness of less than 0.5 mm is tested, it is possible to accurately determine the risk of an IC device D double-overlap state. This can reliable prevent an IC device D double-overlap state.

Figure 5:
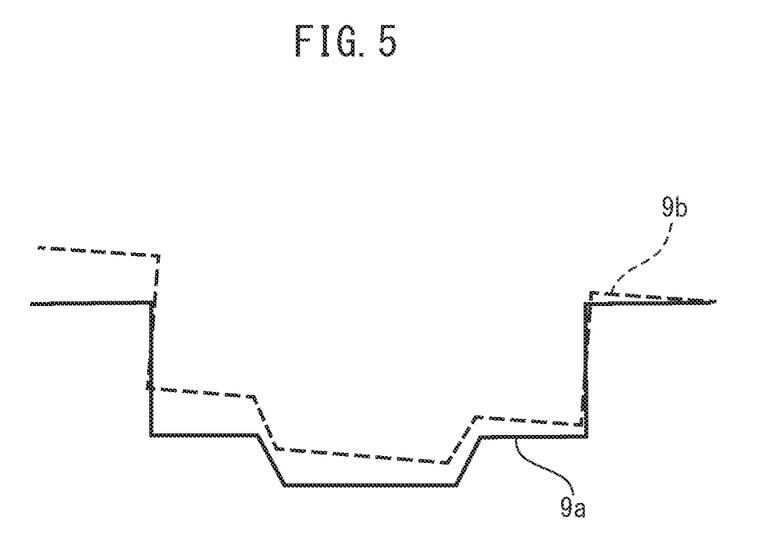
FIG. 5 is a view showing a waveform image measured by the non-contact displacement meter.

Measurement of the displacement measuring unit 7 may be performed by stopping the operation of the loading and discharging processes of the contact head 61. It is possible to operate the displacement measuring unit 7 more slowly than during the loading and discharging processes, and it is possible to perform measurement with higher accuracy. As a result, as shown in FIG. 5, a waveform 9a serving as a measurement reference indicating the surface of the socket 3 stored in advance in the storage part and an actually measured waveform 9b are displayed on the operation screen and compared. If, for example, an inclination occurs in the socket 3, the inclination can be discovered and corrected to a proper state. In such a case, it is not particularly necessary to set an alarm.

Furthermore, a master gauge 11 for calibrating the non-contact displacement meter 71 may be provided in the IC test system 1 at the position to which the robot arm 6 returns to the start point (refer to FIG. 1). The master gauge 11 is formed of a metal block. When the robot arm has returned to the start point, the displacement measuring unit 7 measures the distance from the non-contact displacement meter 71 to the master gauge 11. If a value exceeding a predetermined threshold is measured with respect to the reference distance stored in advance, an alarm is issued.

Furthermore, the robot arm 6 can include a Z axis slider 75 which moves the displacement measuring unit 7 in the vertical direction. By raising the displacement measuring unit 7 using the Z-axis slider 75, and storing the displacement measuring unit 7 within the robot arm 6, maintenance space can be secured, and the displacement measuring unit 7 will not interfere with the exchange of IC devices or the socket.

Figure 7:
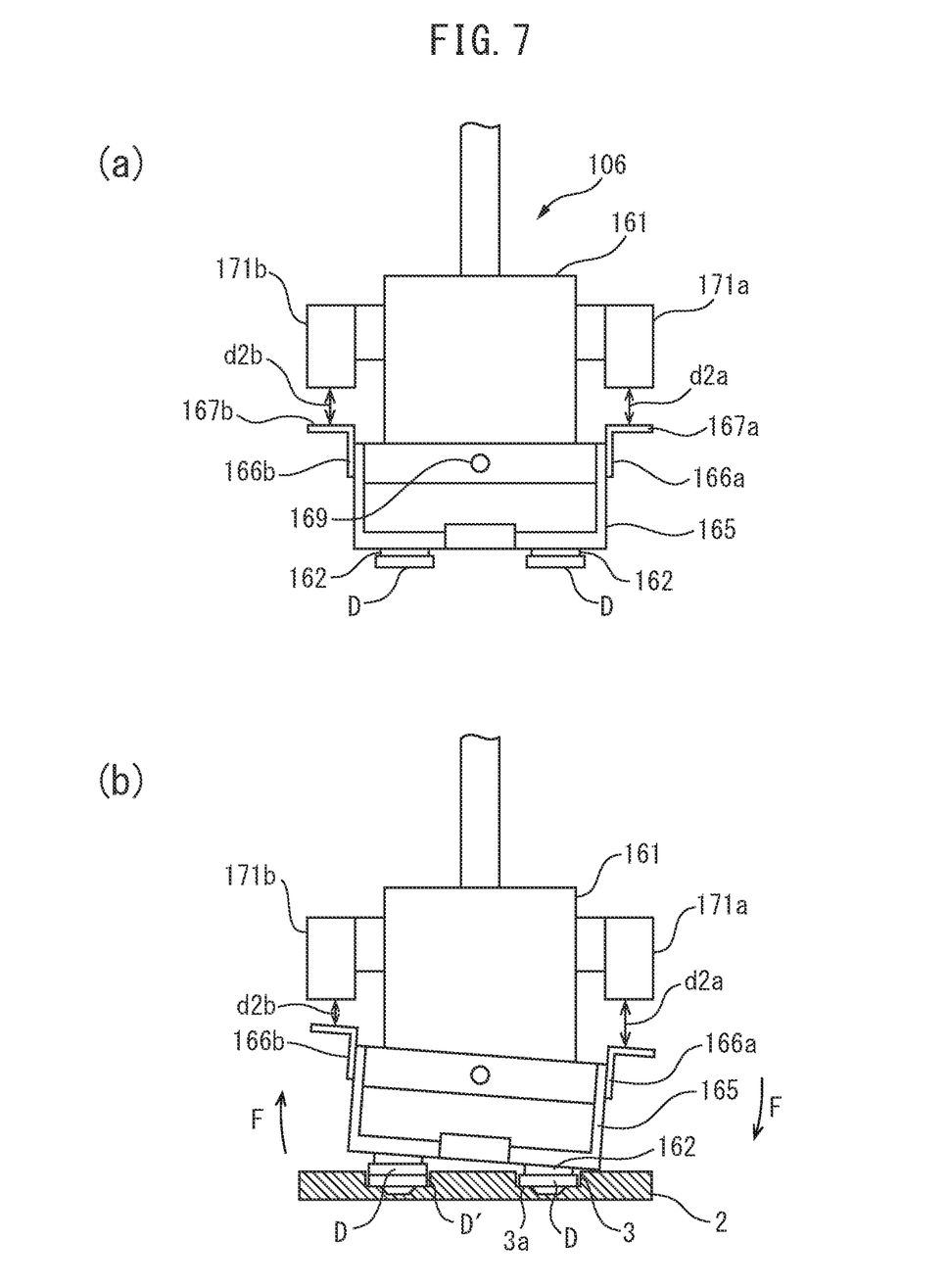

Next, an IC test system 101 according to another embodiment will be described with reference to FIGS. 7(a) and (b). FIGS. 7(a) and b) are enlarged views of a contact head 161 of a robot arm 106 according to the other embodiment, in which (a) shows a state in which the robot arm 106 conveys an IC device D, and (b) shows a state in which the robot arm 106 presses an IC device D into the socket 3 of the test head 2. The IC test system 101 of the present embodiment differs from the IC test system 1 shown in FIG. 2 in that non-contact displacement meter 171 is provided directly on each contact head 161. Furthermore, the contact head 161 includes a holding part 165 that holds the IC devices D. The holding part 165 is supported in the horizontal direction by a pin 169 or the like located at the center of the contact head 11, and is movable in the vertical direction and can rotate.

The contact head 161 of the illustrated embodiment includes non-contact displacement meters 171a and 171b at both ends of the contact head 161. The non-contact displacement meters 171a and 171b are mounted above the holding part 165 which holds the IC devices D. Furthermore, the holding part 165 is provided, at both ends thereof, with flange parts 166a and 166b which are moved in association with the holding part 165. The non-contact displacement meters 171a and 171b can measure the distances from the non-contact displacement meters 171 to the upper surfaces 167a and 167b of the respective flange parts. Measurement is continuously performed during the loading and discharging processes of the IC devices. In the normal case as shown in FIG. 7(a), the distances d2a and d2b measured by the non-contact displacement meters 171a and 171b are nearly the same.

However, as shown in, for example, FIG. 7(b), if for some reason a double-overlap occurs in the socket 3 of the test head 2, the holding part 165 of the contact head 161 rotates in, for example, the direction F in the drawing, and an inclination occurs. Further, a difference occurs between the distances d2a and d2b measured by the non-contact displacement meters 171a and 171b. By determining whether the difference is greater than a predetermined threshold, it is possible to detect a double-overlap. In the IC test system 1 shown in FIG. 2, since measurement is performed only when the non-contact displacement meter 71 passes over the socket 3, measurement time is limited. However, in the present embodiment, since it is possible to perform measurement while the contact head 161 presses the test device D placed on the socket, the measurement time is not limited to the speed of loading and discharging.

The embodiments of the present application have been described above using the drawings. The present invention is not limited to the above embodiments, and various modifications can be made within the scope described in the claims. Furthermore, the above-described dimensions, shapes, materials, etc., of each of the components are merely exemplary, and various dimensions, shapes, materials, etc., can be adopted in order to obtain the effect of the present invention.

EXPLANATION OF NUMERALS 1, 101 IC Test System
10 Base
11 Master Gauge
2 Test Head
3 Socket
3a Placement Surface
4 IC Handler
5 Shift Plate
5a Loading Area
5b Discharge Area
6, 106 Robot Arm
61, 61a, 61b, 161 Contact Head
62, 162 Suction Nozzle
7 Displacement Measuring Unit
71, 71a to 71e, 171, 171a, 171b Non-Contact Displacement Meter
72 Support Rod
73 Vertical Cylinder
74 Vertical Plate
8 Control Unit
81 Storage Part
82 Determination Part
83 Notification Part
d, d2 Measured Distance
$d_0$ Reference Distance
D IC device
δ Difference
t Threshold

The invention claimed is:

1. An IC test system, comprising a robot arm for conveying an IC device from a pair of shift plates arranged side by side to each other to a test head for testing the IC device; wherein
the test head is provided with a socket having a placement surface onto which the IC device is placed;
the robot arm comprises a contact head for holding the IC device while the IC device is conveyed and for pressing the IC device onto the test head during testing, and a non-contact displacement meter that moves in association with the movement of the contact head;
the contact head includes first and second contact heads, which are arranged opposite to each other, and
the non-contact displacement meter is mounted on the robot arm between the first and second contact heads so as to move together with the first and second contact heads in a direction along which the pair of shift plates arranged side by side to each other, and measure a distance in a direction perpendicular to the placement surface.

2. The IC test system according to claim 1, wherein the non-contact displacement meter is mounted on the robot arm so as to measure a distance from the non-contact displacement meter to the placement surface of the socket.

3. The IC test system according to claim 2, wherein, while the robot arm is conveying the IC device, the non-contact displacement meter measures a distance from the non-contact displacement meter to the placement surface of the socket.

4. The IC test system according to claim 1, wherein the contact head comprises a holding part for holding the IC device, and the non-contact displacement meter is mounted above the holding part in the contact head and measures a distance from the non-contact displacement meter to the holding part.

5. The IC test system according to claim 1, further comprising a determination part that determines, based on the distance measured by the non-contact displacement meter, whether or not it is possible that two or more of the IC devices are stacked on the placement surface.

6. The IC test system according to claim 1, wherein the non-contact displacement meter is a laser displacement meter that emits a laser beam.

7. The IC test system according to claim 1, wherein the non-contact displacement meter moves along with the first and second contact head which move along a common guide extending in the direction along which the pair of shift plates arranged side by side to each other.

* * * * *